United States Patent
Matsumoto

(10) Patent No.: US 10,447,162 B2
(45) Date of Patent: Oct. 15, 2019

(54) SWITCHING POWER SUPPLY CIRCUIT HAVING A SWITCHING CIRCUIT AND A COIL CURRENT EMULATION CIRCUIT

(71) Applicant: Torex Semiconductor Ltd., Tokyo (JP)

(72) Inventor: Takashi Matsumoto, Tokyo (JP)

(73) Assignee: Torex Semiconductor Ltd., Tokyo (JP)

( * ) Notice: Subject to any disclaimer, the term of this patent is extended or adjusted under 35 U.S.C. 154(b) by 0 days.

(21) Appl. No.: 15/898,691

(22) Filed: Feb. 19, 2018

(65) Prior Publication Data
US 2018/0241310 A1     Aug. 23, 2018

(30) Foreign Application Priority Data

Feb. 18, 2017 (JP) ................................ 2017-028553
Sep. 12, 2017 (JP) ................................ 2017-175285

(51) Int. Cl.
| | |
|---|---|
| *H02M 3/158* | (2006.01) |
| *H02M 3/338* | (2006.01) |
| *H02M 1/08* | (2006.01) |
| *G01R 19/04* | (2006.01) |
| *H02M 3/335* | (2006.01) |
| *H02M 1/00* | (2006.01) |

(52) U.S. Cl.
CPC .......... *H02M 3/1582* (2013.01); *G01R 19/04* (2013.01); *H02M 1/08* (2013.01); *H02M 3/3385* (2013.01); *H02M 3/33569* (2013.01); *H02M 2001/0009* (2013.01)

(58) Field of Classification Search
CPC .................................................. H02M 3/1582
See application file for complete search history.

(56) References Cited

U.S. PATENT DOCUMENTS 9,837,905 B2    12/2017 Hane
2014/0247026 A1*  9/2014 Svorc .................. H02M 3/156
                                                            323/271

(Continued)

FOREIGN PATENT DOCUMENTS

| JP | 2014039472 A | 2/2014 |
| JP | 2014096962 A | 5/2014 |
| JP | 2017085702 A | 5/2017 |

*Primary Examiner* — Kyle J Moody
*Assistant Examiner* — Trinh Q Dang
(74) *Attorney, Agent, or Firm* — The Webb Law Firm

(57) ABSTRACT

A switching power supply circuit, which keeps an output voltage constant highly accurately by a buck-boost action, is provided. The switching power supply circuit comprises: a switching circuit formed by combining four switching elements with a coil in the shape of H; a coil current emulation circuit for generating an output voltage VC similar to a coil current; and a control circuit which, based on a feedback voltage representing an output voltage VO of the switching circuit, and the output voltage VC, performs on-off control of the switching circuit. The coil current emulation circuit has a CR integration circuit to generate the output voltage VC similar to the coil current. One of three voltages is applied to one terminal of the CR integration circuit, while a voltage proportional to the output voltage VO is applied to the other terminal of the CR integration circuit. The three voltages are a voltage proportional to an input voltage VIN, a ground voltage, and a voltage proportional to the sum of the input voltage VIN and the output voltage VO.

4 Claims, 15 Drawing Sheets

(56) References Cited

U.S. PATENT DOCUMENTS

2015/0200593 A1\* 7/2015 Stoichita ............... H02M 3/158
323/271
2017/0187290 A1\* 6/2017 Li ...................... H02M 3/1582

\* cited by examiner

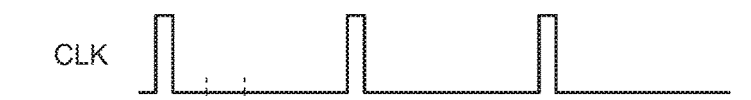
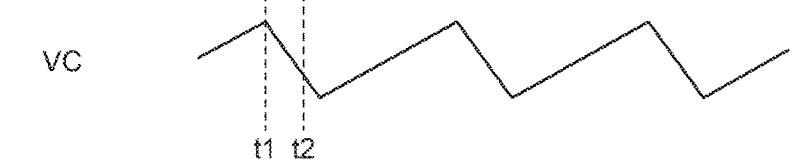

FIG. 3A CLK 
FIG. 3B Comp_out 
FIG. 3C LX1 
FIG. 3D LX2 
FIG. 3E IL 
FIG. 3F V1 A×(VIN + VO) A×VIN 
FIG. 3G V2 A×VO 
FIG. 3H VC 
t1 t2

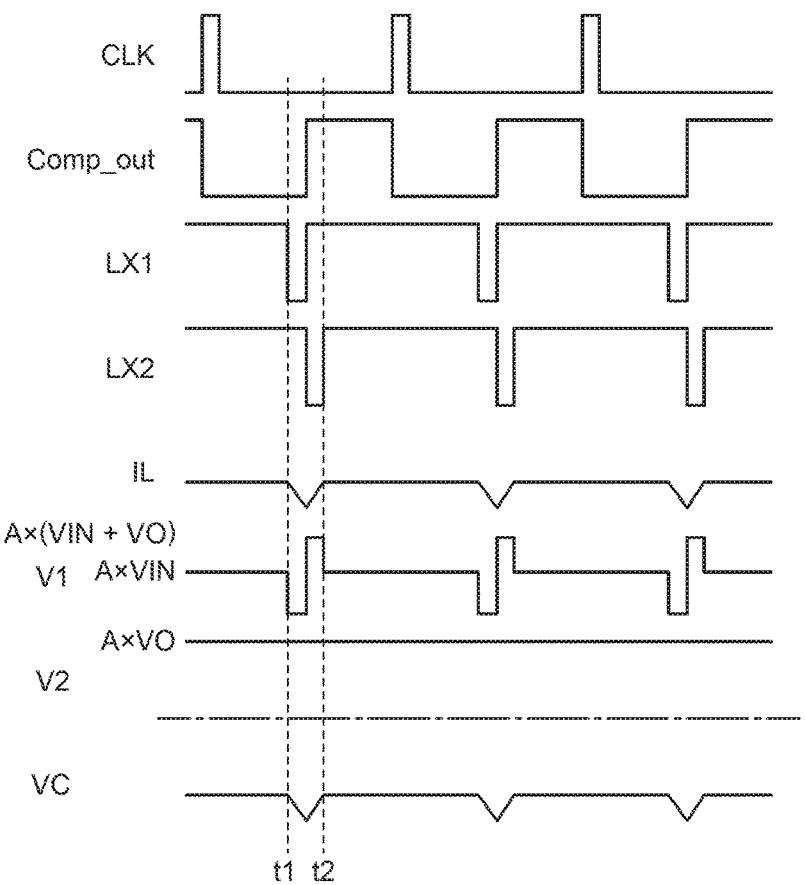

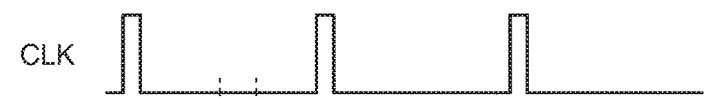
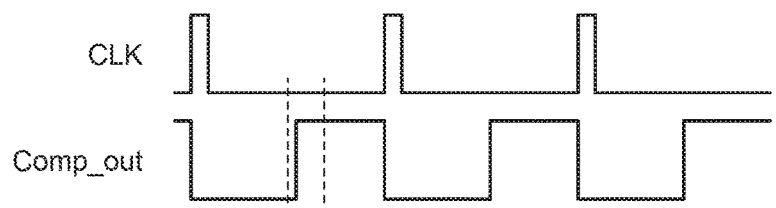
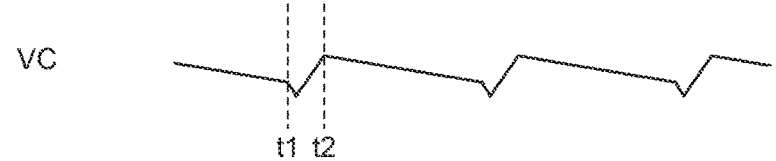

FIG. 6A CLK 
FIG. 6B Comp_out 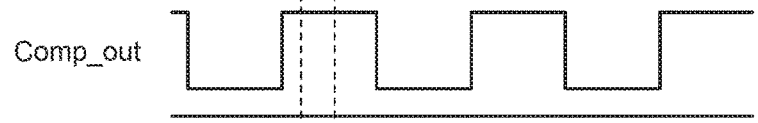
FIG. 6C LX1 
FIG. 6D LX2 
FIG. 6E IL 
FIG. 6F V1 A×(VIN + VO) / A×VIN 
FIG. 6G V2 A×VO 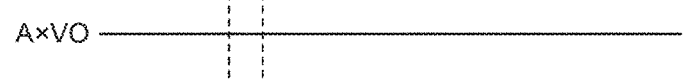
FIG. 6H VC 
t1 t2

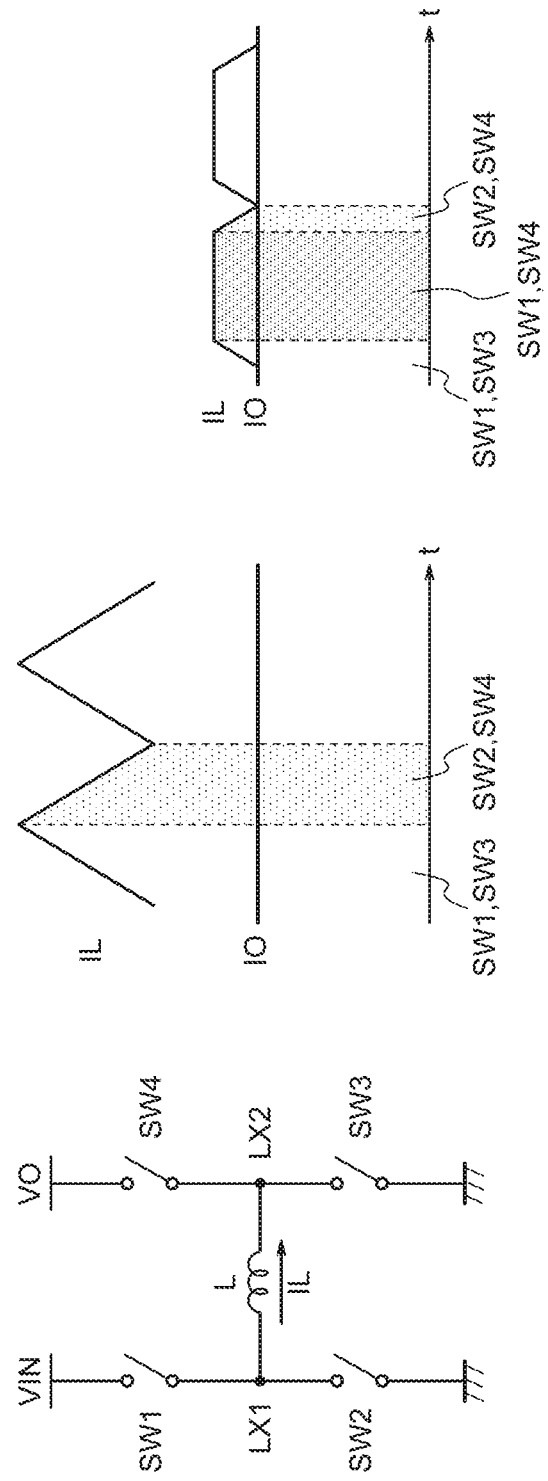

FIG. 10A  CLK 
FIG. 10B  Comp_out 
FIG. 10C  LX1 
FIG. 10D  LX2 
FIG. 10E  IL 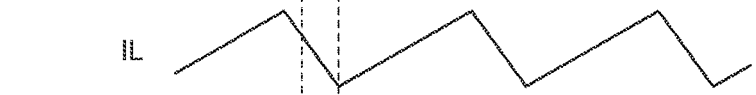
FIG. 10F  V1  A×(VIN + VO) / A×VIN 
FIG. 10G  V2  A×VO 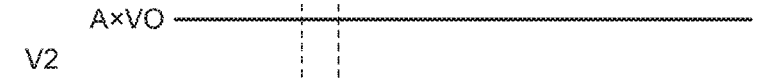
FIG. 10H  VC 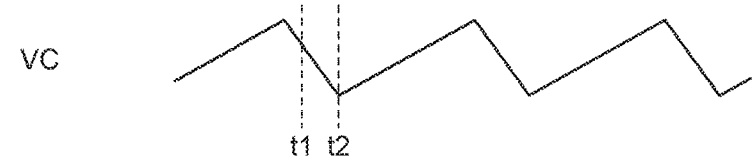
t1 t2

FIG. 11A  CLK
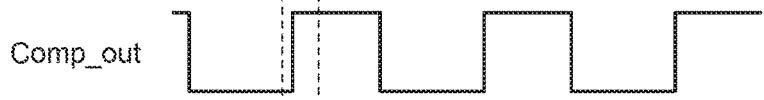
FIG. 11B  Comp_out
FIG. 11C  LX1
FIG. 11D  LX2
FIG. 11E  IL
FIG. 11F  V1   A×(VIN + VO)   A×VIN
FIG. 11G  V2   A×VO
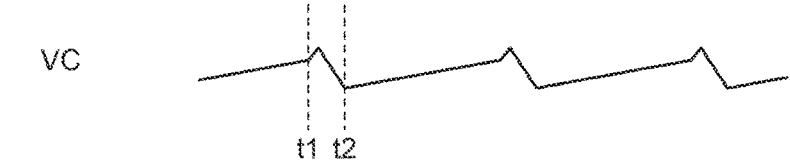
FIG. 11H  VC
t1 t2

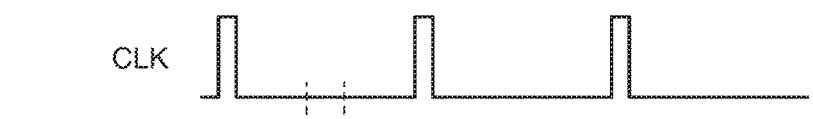
FIG. 12A   CLK
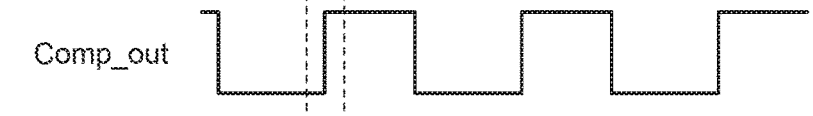
FIG. 12B   Comp_out
FIG. 12C   LX1
FIG. 12D   LX2
FIG. 12E   IL
FIG. 12F   A×(VIN + VO)   V1   A×VIN
FIG. 12G   A×VO   V2
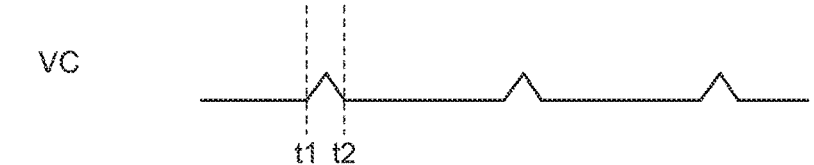
FIG. 12H   VC
t1 t2

FIG. 13A CLK 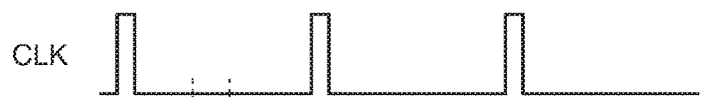
FIG. 13B Comp_out 
FIG. 13C LX1 
FIG. 13D LX2 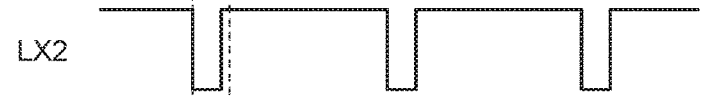
FIG. 13E IL 
FIG. 13F V1 $A \times (V_{IN} + V_O)$ / $A \times V_{IN}$ 
FIG. 13G V2 $A \times V_O$ 
FIG. 13H VC 
t1 t2

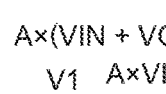

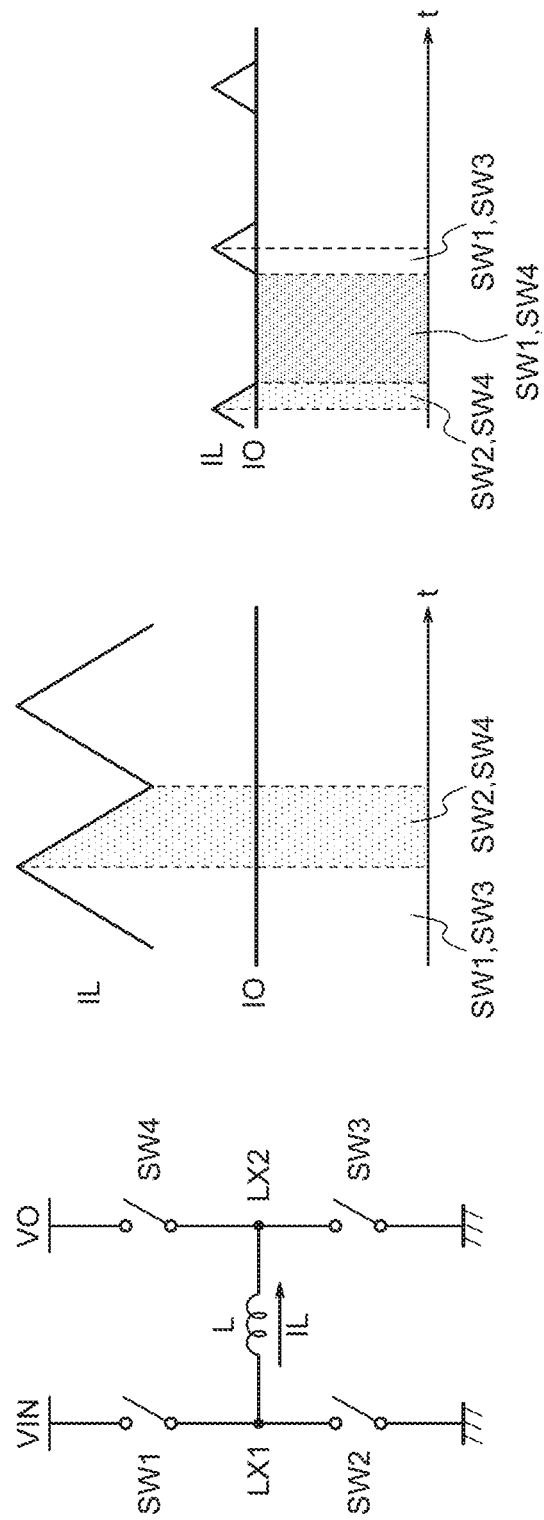

SWITCHING POWER SUPPLY CIRCUIT HAVING A SWITCHING CIRCUIT AND A COIL CURRENT EMULATION CIRCUIT

CROSS-REFERENCE TO RELATED APPLICATIONS

This application claims priority to Japanese Patent Application Nos. 2017-028553 and 2017-175285, filed Feb. 18, 2017 and Sep. 12, 2017, respectively, the disclosures of which are hereby incorporated in their entirety by reference.

TECHNICAL FIELD

This invention relates to a switching power supply circuit and, more specifically, to that useful when applied to a buck-boost DC/DC converter.

BACKGROUND ART

Patent Document 1 shows a publicly known switching power supply circuit which is a switching regulator of peak detection topology; can utilize a low ESR capacitor, such as a ceramic capacitor, for load capacity; is capable of stable operation even at an oscillation frequency of several MHz or more and also provides high stability under load; and can reduce a layout area.

The switching power supply circuit disclosed in Patent Document 1, however, is dedicated to step-down conversion, thus posing the problem that it is not usable under conditions where an input voltage is higher or lower than an output voltage.

On the other hand, there is a buck-boost switching power supply circuit which can utilize a low ESR capacitor, such as a ceramic capacitor, for load capacity; and is capable of stable operation even at an oscillation frequency of several MHz or higher. Such a switching power supply circuit has been made known to the public by Patent Document 2.

The switching power supply circuit according to Patent Document 2 is of a so-called current mode control type which detects a coil current and controls a switching action based thereon. This type of switching power supply circuit requires the detection of the coil current.

With conventional technologies including that of Patent Document 2, when a coil current is to be detected, a technology using a coil current sensing circuit has been in wide use. This technology is adapted, for example, to insert a sense resistor in series with a coil, amplify the values at both ends of the sense resistor with a current amplifier, and connect the output of the current amplifier to the output of an error amplifier via a coupling capacitor.

PRIOR ART DOCUMENTS

Patent Documents

[Patent Document 1] Japanese Patent No. 5997348
[Patent Document 2] JP-A-2014-39472

In the above-mentioned coil current detection circuit, the sense resistor having a low value has to be selected in order to reduce an influence on an output voltage conversion efficiency. Consequently, an amplifier having a low offset voltage conformed to a low input voltage has to be used as the current amplifier. Since large transistors of an input differential pair may be used, a plurality of such transistors may be used, or an adjustment by trimming or the like may be made, the problem arises that a great influence on a layout pattern is exerted. Thus, the circuit scale of the coil current detection circuit is widened and, at the same time, a current consumption is increased to drive a high speed comparator. Furthermore, such events constitute an impediment to the high speed operation of a switching frequency in this type of switching power supply circuit.

SUMMARY OF THE INVENTION

Problems to be Solved by the Invention

The present invention has been accomplished in the light of the above-described earlier technologies. It is an object of the invention to provide a switching power supply circuit which can utilize a capacitor with low ESR for load capacity, is capable of stable operation even at an oscillation frequency of several MHz or more, obtains high load stability, and keeps an output voltage constant highly accurately by a buck-boost action.

Means for Solving the Problems

A first aspect of the present invention for attaining the above object is a switching power supply circuit comprising:
a switching circuit having a first switching element connected between an input terminal, where an input voltage is applied, and one terminal of a coil; a second switching element or a first diode connected between a ground potential and the one terminal; a third switching element connected between the ground potential and another terminal of the coil; and a fourth switching element or a second diode connected between the output terminal and the other terminal;
a coil current emulation circuit for generating an output voltage similar to a coil current flowing through the coil; and
a control circuit which, based on a feedback voltage representing an output voltage being a voltage of the output terminal, and the output voltage of the coil current emulation circuit, performs on-off control of the switching circuit to have the switching circuit carry out a predetermined buck-boost action so that the output voltage generated at the output terminal of the switching circuit becomes a predetermined set voltage,
wherein the coil current emulation circuit has a CR integration circuit, and provides an output terminal, between a capacitor and a resistor constituting the CR integration circuit, for outputting the output voltage similar to the coil current,
one of three voltages is applied to one terminal of the CR integration circuit by selection associated with an on/off action of switch means, while a voltage proportional to the output voltage is applied to another terminal of the CR integration circuit, and
the three voltages are a voltage proportional to the input voltage, a ground voltage, and a voltage proportional to a sum of the input voltage and the output voltage, and on/off control of the switch means is performed by a control signal which is inputted by the control circuit in accordance with a state of the one terminal and the other terminal of the coil.

A second aspect of the present invention is the switching power supply circuit according to the first aspect, wherein the control circuit comprises:
an error amplification circuit for comparing a predetermined reference voltage with the feedback voltage, and amplifying an error representing a difference between the reference voltage and the feedback voltage to generate an error voltage;

a valley detection circuit for detecting a valley, where the coil current is minimal, based on the output voltage similar to the coil current, the error voltage, and the reference voltage, to generate a valley detection signal representing the valley; and a switch control unit which generates a switching signal for performing changeover control of the switching element based on the valley detection signal and a predetermined timing representing passage of a preset time, thereby performing the predetermined buck-boost action via the switching circuit; and performs the on/off control of the switch means by the control signal.

A third aspect of the present invention is the switching power supply circuit according to the first aspect, wherein
the control circuit comprises:
an error amplification circuit for comparing a predetermined reference voltage with the feedback voltage, and amplifying an error representing a difference between the reference voltage and the feedback voltage to generate an error voltage;
a peak detection circuit for detecting a peak, where the coil current is maximal, based on the output voltage similar to the coil current, the error voltage, and the reference voltage, to generate a peak detection signal representing the peak; and
a switch control unit which generates a switching signal for performing changeover control of the switching element based on the peak detection signal and a predetermined timing representing passage of a preset time, thereby performing the predetermined buck-boost action via the switching circuit; and performs the on/off control of the switch means by the control signal.

A fourth aspect of the present invention is the switching power supply circuit according to the second aspect, wherein
the valley detection circuit comprises:
a summing circuit for adding the output voltage similar to the coil current to the error voltage to generate an addition output voltage; and
a valley detecting comparison circuit for comparing the addition output voltage with the reference voltage to detect the valley.

A fifth aspect of the present invention is the switching power supply circuit according to the third aspect, wherein
the peak detection circuit comprises:
a summing circuit for adding the output voltage similar to the coil current to the error voltage to generate an addition output voltage; and
a peak detecting comparison circuit for comparing the addition output voltage with the reference voltage to detect the peak.

A sixth aspect of the present invention is the switching power supply circuit according to the second or third aspect, wherein
the timing is defined based on the output voltage, the input voltage, or the reference voltage.

Effects of the Invention

According to the present invention, the coil current is detected based on the output voltage similar to the coil current. Thus, there is no need to provide a sense resistor or the like for detecting the coil current. Since the configuration for coil current detection can be simplified, detection of the coil current can be performed appropriately, even when the switching frequency is high. As a result, a low ESR capacitor can be utilized for load capacity in any of the buck, boost and buck-boost modes, and stable operation is possible even at an oscillation frequency of several MHz or higher.

BRIEF DESCRIPTION OF THE DRAWINGS

FIGS. 2A-2H are explanation drawings showing the timing of a buck action in the switching power supply circuit shown in FIG. 1.

FIGS. 3A-3H are explanation drawings showing the timing of a buck-boost action in the switching power supply circuit shown in FIG. 1.

FIGS. 4A-4H are explanation drawings showing the timing of the buck-boost action in the switching power supply circuit shown in FIG. 1.

FIGS. 5A-5H are explanation drawings showing the timing of the buck-boost action in the switching power supply circuit shown in FIG. 1.

FIGS. 6A-6H are explanation drawings showing the timing of a boost action in the switching power supply circuit shown in FIG. 1.

FIGS. 7A-7C are schematic views showing moves during a full-bridge action in the switching power supply circuit shown in FIG. 1.

FIGS. 10A-10H are explanation drawings showing the timing of a buck action in the switching power supply circuit shown in FIG. 9.

FIGS. 11A-11H are explanation drawings showing the timing of a buck-boost action in the switching power supply circuit shown in FIG. 9.

FIGS. 12A-12H are explanation drawings showing the timing of the buck-boost action in the switching power supply circuit shown in FIG. 9.

FIGS. 13A-13H are explanation drawings showing the timing of the buck-boost action in the switching power supply circuit shown in FIG. 9.

FIGS. 14A-14H are explanation drawings showing the timing of a boost action in the switching power supply circuit shown in FIG. 9.

FIGS. 15A-15C are schematic views showing moves during a full-bridge action in the switching power supply circuit shown in FIG. 9.

MODE FOR CARRYING OUT THE INVENTION

The switching power supply circuit according to the present invention can be configured in two types, a valley detection system and a peak detection system. The valley detection system is designed to make a changeover from an OFF-period to an ON-period of switching based on detection of a valley in a coil current IL. The peak detection system, on the other hand, is designed to make a changeover from the ON-period to the OFF-period of switching based on detection of a peak in the coil current IL. Embodiments of the switching power supply circuit of the present invention concerned with both systems will now be described in detail with reference to the accompanying drawings.

<First Embodiment>

Figure 1:
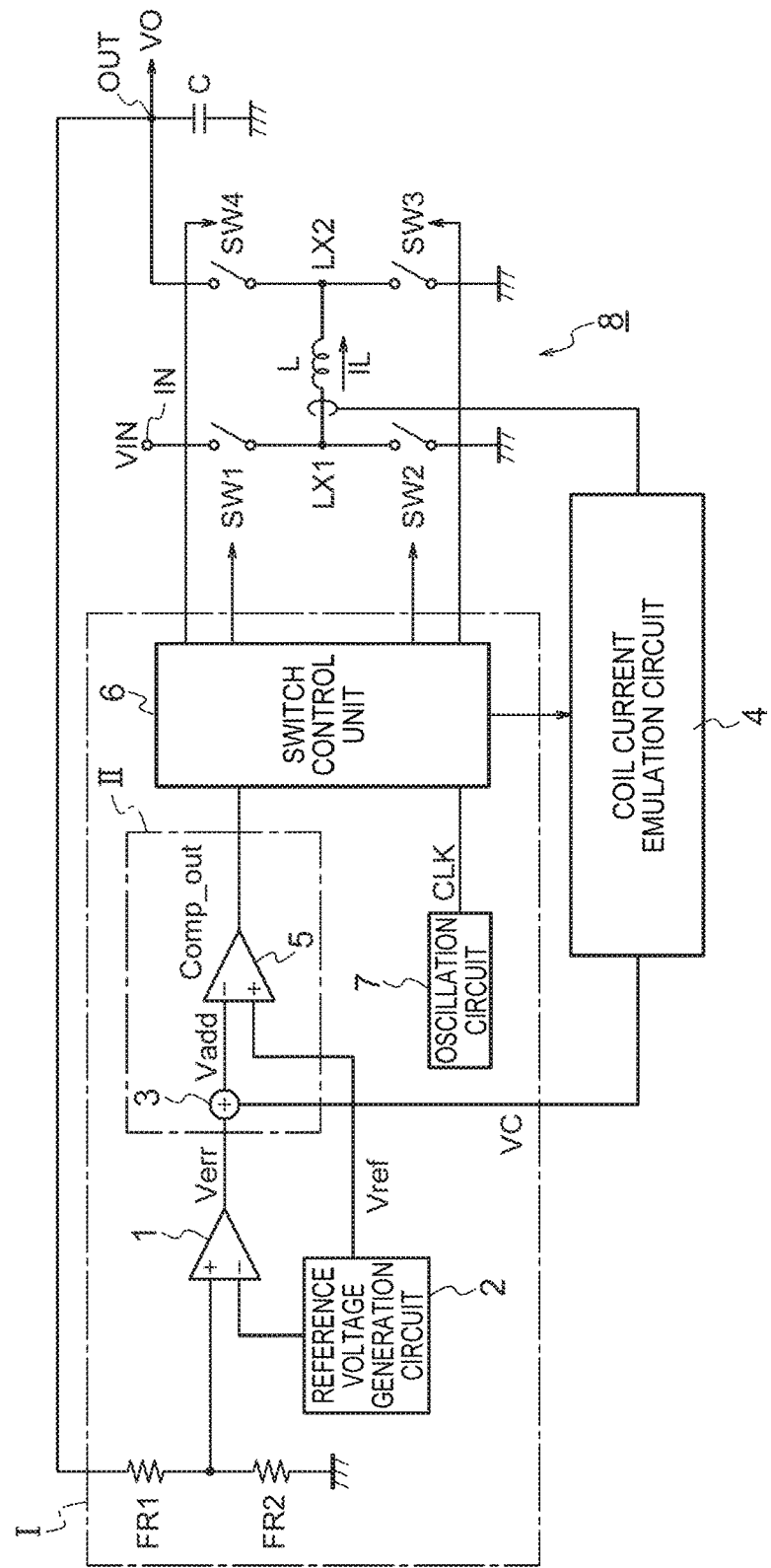
FIG. 1 is a block diagram showing a switching power supply circuit according to a first embodiment of the present invention.

FIG. 1 is a block diagram showing the switching power supply circuit according to a first embodiment of the present invention. This switching power supply circuit is an example on the valley detection system.

As shown in FIG. 1, the switching power supply circuit according to the present embodiment has a control circuit I, a coil current emulation circuit 4, and a switching circuit 8. The control circuit I performs ON/OFF control of the switching circuit 8, based on a feedback voltage, which represents an output voltage VO being a voltage of an output terminal OUT, and an output voltage VC of the coil current emulation circuit 4, to have the switching circuit 8 carry out a predetermined buck, boost or buck-boost action so that the output voltage VO generated at the output terminal OUT of the switching circuit 8 becomes a predetermined set voltage. For this purpose, the control circuit I according to the present embodiment is equipped with an error amplification circuit 1, a reference voltage generation circuit 2, a valley detection circuit II composed of a summing circuit 3 and a comparison circuit 5, a switch control unit 6, and an oscillation circuit 7.

The output voltage VO is divided by feedback resistors FR1, FR2, and inputted to a non-inverting input terminal of the error amplification circuit 1. On the other hand, an inverting input terminal of the error amplification circuit 1 receives an input of a reference voltage Vref which has been generated by the reference voltage generation circuit 2 and preliminarily set. Thus, the error amplification circuit 1 compares the reference voltage Vref with the output voltage VO divided by the feedback resistors FR1, FR2, amplifies an error which is the difference between Vref and VO, and outputs the amplified value as an error voltage Verr.

The valley detection circuit II is supplied with the output voltage VC of the coil current emulation circuit 4 which is similar to the coil current IL flowing through a coil L; the error voltage Verr, and the reference voltage Vref. Based on these voltages, i.e., output voltage VC, error voltage Verr, and reference voltage Vref, the valley detection circuit II detects a valley where the coil current IL is minimal, to generate a valley detection signal Comp_out.

The valley detection circuit II in the present embodiment is composed of the summing circuit 3 and the comparison circuit 5. In the summing circuit 3, the output voltage VC similar to the coil current IL is added to the error voltage Verr, which is the output of the error amplification circuit 1, to generate an addition output voltage Vadd. The output voltage VC is generated in the coil current emulation circuit 4, as will be described in detail later through a configuration for its generation.

A non-inverting input terminal of the comparison circuit 5 receives an input of the reference voltage Vref which is the output of the reference voltage generation circuit 2, while an inverting input terminal of the comparison circuit 5 receives an input of the addition output voltage Vadd which is the output of the summing circuit 3. As a result, the comparison circuit 5 generates the valley detection signal Comp_out, which represents a time point at which the addition output voltage Vadd of the summing circuit 3 falls short of the reference voltage Vref, namely, a time point at which the coil current IL takes the lowest value, and outputs this valley detection signal Comp_out to the switch control unit 6. The valley detection signal Comp_out is a state signal representing two states, Hi and Lo.

In the present embodiment, the valley detection circuit II is formed from a combination of the summing circuit 3 and the comparison circuit 5, as described above, but this is not limiting. As long as the valley detection circuit II is configured to detect the valley, where the coil current IL is minimal, based on the output voltage VC similar to the coil current IL, the error voltage Verr, and the reference voltage Vref, there is no more special limitation. In the present embodiment, moreover, the summing circuit 3 adds the output voltage VC to the error voltage Verr, and the addition output voltage Vadd from the summing circuit 3 is compared with the reference voltage Vref, but these features are not limiting. It suffices that the valley detection circuit II is configured to generate the addition output voltage Vadd based on the error voltage Verr, the reference voltage Vref, and the output voltage VC.

The switch control unit 6 controls ON/OFF of switching elements SW1, SW2, SW3, SW4 of the switching circuit 8 at a timing, which represents the passage of a preset elapsed time (to be described in detail later), in accordance with a change in the state of the valley detection signal Comp_out, based on a clock signal CLK of a constant frequency generated by the oscillation circuit 7. Consequently, the switch control unit 6 switches among a buck mode, a buck-boost mode, and a boost mode, as appropriate, to keep the output voltage VO constant. Simultaneously, the switch control unit 6 also controls the switching action of switch means S1, S2, S3 (see FIG. 8) of the coil current emulation circuit 4 to be described in detail later. The concrete contents of switching control by the switch control unit 6 will be described in detail later.

The valley detection signal Comp_out, which is the output of the comparison circuit 5, is normally in the Lo state, and enters the Hi state upon detection of a valley point.

The switching circuit 8 is formed by combining the four switching elements SW1 to SW4 with the coil L in the shape of H. In further detail, the switching element SW1 is connected between an input terminal IN, where an input voltage VIN being a power supply voltage, and one terminal LX1 of the coil L; the switching element SW2 is connected between a ground potential and the one terminal LX1; the switching element SW3 is connected between the ground potential and the other terminal LX2 of the coil L; and the switching element SW4 is connected between the output terminal OUT and the other terminal LX2. To the output terminal OUT, a smoothing capacitor C is connected. In the present embodiment, a capacitor with low ESR, such as a ceramic capacitor, can be used as the capacitor C.

The control actions of the switch control unit 6 in respective modes, buck mode, buck-boost mode, and boost mode, will be described based on waveform charts of FIGS. 2 to 6. In FIGS. 2 to 6, (a) shows the waveform of the clock signal, (b) shows the waveform of the valley detection signal Comp_out, (c) shows the waveform of the voltage at the one terminal LX1, (d) shows the waveform of the voltage at the other terminal LX2, and (e) shows the waveform of the coil current IL. In each of the drawings, (f) to (h) show the waveforms in the respective parts of the coil current emulation circuit 4 (see FIG. 8) in the respective modes. More detailedly, in each drawing, (f) shows the waveform of a voltage at one terminal V1 (see FIG. 8), (g) shows the waveform of a voltage at the other terminal V2 (see FIG. 8), and (h) shows the waveform of the output voltage VC (see FIG. 8).

<Buck Mode>

FIG. 2 is the waveform chart in the buck mode. As shown in this drawing, first of all, the valley detection signal Comp_out, which is the output of the valley detecting comparison circuit 5, is reset with the use of the clock signal CLK of the oscillation circuit 7. As a result, the valley detection signal Comp_out enters the Lo state.

Then, the one terminal LX1 of the coil L is switched from the Hi level to the Lo level (the switching element SW1 is turned OFF) at a first timing t1 of two timings preset within the switch control unit 6 in accordance with the input voltage VIN, the output voltage VO, or the reference voltage Vref. At this time, the terminal LX2 remains at the Hi level (the switching element SW4 remains ON). Since the terminal LX1 falls into the Lo level, an OFF-period in which the coil current IL gradually decreases is provided.

At this time, the output voltage of the coil current emulation circuit 4 has been added to the output voltage of the error amplification circuit 1. In the valley detecting comparison circuit 5, therefore, the addition output of the summing circuit 3 based on the coil current IL is compared with the reference voltage Vref. If, as a result, the valley point where the coil current IL is minimal is detected, the output level of the valley detection signal Comp_out is switched to Hi, and latched there, to switch the one terminal LX1 to the Hi level (switch the switching element SW1 to ON). As a result, an ON-period in which the coil current IL gradually increases is provided.

Then, the valley detection signal Comp_out is reset by the clock signal CLK to initiate a new cycle. Here, a second timing t2 comes earlier than the changeover of the valley detection signal Comp_out, and thus becomes ineffective. By repeating such a series of actions and working as a buck converter, the circuit of the present embodiment stabilizes the output voltage VO.

<Buck-Boost Mode>

FIGS. 3 to 5 are the waveform charts in the buck-boost mode. Although these drawings are all in the buck-boost mode, FIG. 3 shows a state where the input voltage VIN is higher than the output voltage VO, FIG. 4 shows a state where the input voltage VIN is equal to the output voltage VO, and FIG. 5 shows a state where the input voltage VIN is lower than the output voltage VO.

In the buck-boost mode, as shown in FIGS. 3 to 5, the valley detection signal Comp_out is reset by the clock signal CLK, as in the buck mode. At the timing t1, the one terminal LX1 is switched from the Hi level to the Lo level, bringing out an OFF-period (turning the switching element SW1 OFF). As a result, the coil current IL is on the decrease. Unlike the buck mode, however, the comparison circuit 5 detects the valley point earlier than the timing t2. Thus, at the same time that the one terminal LX1 is switched to the Hi level (the switching element SW1 is turned ON), the other terminal LX2 is switched to the Lo level (the switching element SW3 is turned ON).

Then, at the timing t2, the action of returning the other terminal LX2 to the Hi level is performed (the switching element SW3 is turned OFF). This action is repeated, whereby the circuit of the present embodiment is made to function as a buck-boost converter to stabilize the output voltage VO.

In the present embodiment, the buck-boost action is realized by combining the buck action of switching the one terminal LX1 and the boost action of switching the other terminal LX2. In the buck-boost action, the period during which both the one terminal LX1 and the other terminal LX2 are at the Hi level is provided, whereby changes in the coil current IL due to the full-bridge action can be kept small. This feature can contribute to an improvement in the conversion efficiency of the switching power supply circuit.

At the boundary between the buck mode and the buck-boost mode, the mode of action shifts owing to the presence or absence of extremely tiny pulses in the other terminal LX2. Thus, great changes in the coil current due to a mode difference do not occur, and continuity can be maintained. This can contribute to a stable action. A detailed explanation in this connection will be offered based on FIGS. 7(*a*) to 7(*c*).

FIG. 7(*a*) shows the same switching circuit 8 as that in the present embodiment. When the switching circuit 8 is driven with the full-bridge action of alternately repeating the ON-state of the switching elements SW1, SW3 and the ON-state of the switching elements SW2, SW4, the coil current IL increases as shown in FIG. 7(*b*), and its loss also increases correspondingly. In the present embodiment, therefore, a period during which the switching elements SW1, SW3 are kept in the ON-state is provided from a predetermined timing after the coil current IL exceeds a predetermined output current IO in the ON-state of the switching elements SW1, SW3 until a predetermined timing before the coil current IL falls short of the output current IO in the ON-state of the switching elements SW2, SW4, as shown in FIG. 7(*c*). By so doing, the coil current IL during the period of the ON-state of the switching elements SW1, SW3 can be kept down to a constant low value. As a result, losses can be decreased markedly.

<Boost Mode>

FIG. 6 is the waveform chart in the boost mode. After resetting of the valley detection signal Comp_out by the clock signal CLK, the valley detection signal Comp_out changes to Hi earlier than the timing t1, so that the other terminal LX2 is switched to Lo (the switching element SW3 is turned ON). This period is an ON-period during which the coil current IL gradually increases. Then, at the timing t2, the other terminal LX2 is switched to the Hi level (the switching element SW3 is switched to OFF), bringing out an OFF-period. Here, the timing t1 comes later than the changeover of the valley detection signal Comp_out, namely, the time point of valley detection in the coil current IL, and thus becomes ineffective. By repeating such actions, the circuit of the present embodiment works as a boost converter to stabilize the output voltage.

Because of the above-described actions, the switching power supply circuit according to the present embodiment works as a buck-boost switching regulator. Particularly when the load abruptly becomes heavy in the boost mode, leading to a fall in the output voltage, detection of the valley detection signal Comp_out occurs at an earlier timing. As a result, the ON-period is prolonged to increase the coil current IL and return the output voltage VO rapidly. When the load suddenly becomes heavy in the buck-boost mode or the buck mode, leading to a fall in the output voltage VO, moreover, detection of the valley detection signal Comp_out similarly occurs at an earlier timing. If this detection occurs earlier than the timing t1, the circuit of the present embodiment works in the boost mode, and thus acts in a direction in which the output is increased more rapidly. This means that the switching power supply circuit according to the present embodiment exhibits a high effect of stabilizing the output in the presence of a sudden change in the load.

Next, detection of the coil current IL will be described. If the coil current IL is detected using a sense resistor, problems as described in the aforementioned paragraph [0009] are posed. In the present embodiment, therefore, the output voltage VC similar to the coil current IL is generated by the coil current emulation circuit 4, and this output voltage VC is utilized to obtain information on the predetermined coil current IL.

It is to be noted here that the switching power supply circuit according to the present embodiment allows the switching circuit 8 constituting the H-shaped bridge to perform the predetermined switching action and work in all of the buck, boost and buck-boost modes. If an integration circuit is merely connected between the one terminal LX1 and the other terminal LX2 of the switching circuit 8, therefore, the terminals LX1, LX2 both have nodes switching. In this situation, the resulting waveform is not similar to that of the coil current IL.

In the present embodiment, it is therefore necessary to fix one end of a CR integration circuit, and apply a voltage in proportional relationship with a potential difference between both ends of the coil L as a potential difference between both ends of the CR integration circuit. In consideration of this necessity, the coil current emulation circuit 4 is configured in the present embodiment. Its concrete configuration will be described below.

Figure 8:
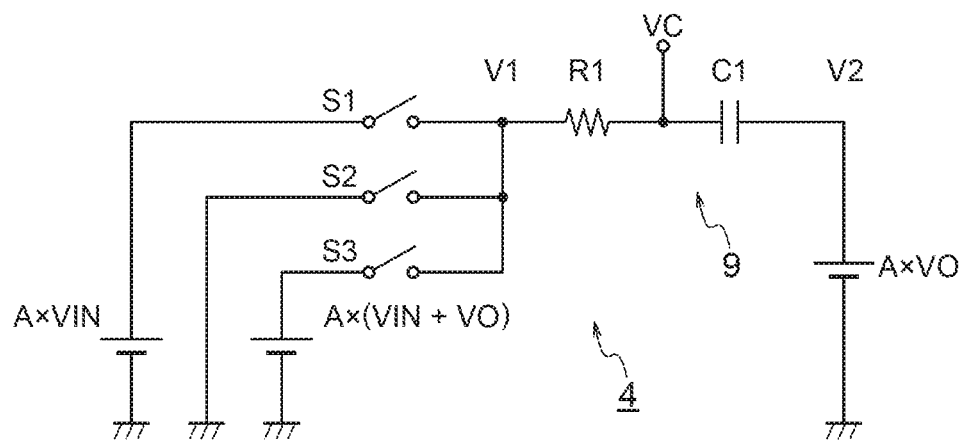
FIG. 8 is a circuit diagram showing a coil current emulation circuit which is a concrete example of a coil current detection circuit.

As shown in FIG. 8, the coil current emulation circuit 4 in the present embodiment has a CR integration circuit 9 composed of a capacitor C1 and a resistor R1 connected in series, and has a portion between the capacitor C1 and the resistor R1 as an output terminal where the output voltage VC similar to the coil current IL is generated.

One of three voltages is applied to one terminal V1 of the CR integration circuit 9 by the selection of switch means S1, S2, S3, whereas a voltage (A×VO) proportional to the output voltage VO (see FIG. 1; the same applies hereinafter) is applied to the other terminal V2 of the CR integration circuit. The three voltages are a voltage (A×VIN) proportional to the input voltage VIN (see FIG. 1; the same applies hereinafter), the ground voltage, and a voltage (A×(VIN+ VO)) proportional to the sum of the input voltage VIN and the output voltage VO.

When, in the coil current emulation circuit 4, the one terminal LX1 (see FIG. 1; the same applies hereinafter) and the other terminal LX2 (see FIG. 1; the same applies hereinafter) of the switching circuit 8 (see FIG. 1; the same applies hereinafter) are both at the Hi level, the switch means S1 is turned ON, whereby the voltage (A×VIN) proportional to the input voltage VIN is applied to one end of the integration circuit 9. When the one terminal LX1 is at the Lo level and the other terminal LX2 is at the Hi level, the switch means S2 is turned ON to apply the GND voltage to the one end of the integration circuit 9. Furthermore, when the one terminal LX1 is at the Hi level and the other terminal LX2 is at the Lo level, the switch means S3 is turned ON, whereby the voltage (A×(VIN+VO)) proportional to the sum of the input voltage VIN and the output voltage VO is applied to the one end of the integration circuit 9. The proportionality coefficient A is set at the same value.

The respective switch means S1 to S3 of the coil current emulation circuit 4 are subjected to ON/OFF control by the control signal from the switch control unit 6 (see FIG. 1; the same applies hereinafter) in accordance with the states of the one terminal LX1 and the other terminal LX2 of the coil 1.

Assume that the voltage at the one end of the resistor R1 is V1, the voltage at the other end of the capacitor C1 is V2, and the switching cycle is sufficiently shorter than the time constant of the CR integration circuit 9. In this case, the potential difference ΔVC between both ends of the capacitor C1 is represented by Equation (1):

[Mathematical 1]

$$\Delta VC = \frac{V1 - V2}{R1} \times \frac{1}{C1} \times t \qquad (1)$$

Likewise, the coil current ΔiL is represented by Equation (2):

[Mathematical 2]

$$\Delta iL = \frac{VLX1 - VLX2}{L} \times t \qquad (2)$$

Concretely, when the one terminal LX1 and the other terminal LX2 are both at the Hi level, the switch means S1 is turned ON. Thus, the potential difference ΔVC is represented by Equation (3), and the coil current ΔiL is represented by Equation (4).

[Mathematical 3]

$$\Delta VC = \frac{A \times VIN - A \times VO}{R1} \times \frac{1}{C1} \times t \qquad (3)$$

$$\Delta iL = \frac{VLX1 - VLX2}{L} \times t \qquad (4)$$

When the one terminal LX1 is at the Lo level, and the other terminal LX2 is at the Hi level, the switch means S2 is turned ON. Assuming here that the Lo level is 0V, the potential difference ΔVC is represented by Equation (5) and the coil current ΔiL is represented by Equation (6).

[Mathematical 4]

$$\Delta VC = \frac{-A \times VO}{R1} \times \frac{1}{C1} \times t \qquad (5)$$

$$\Delta iL = \frac{-VLX2}{L} \times t \qquad (6)$$

When the one terminal LX1 is at the Hi level, and the other terminal LX2 is at the Lo level, the switch means S3 is turned ON. Assuming here that the Lo level is 0V, the potential difference ΔVC is represented by Equation (7) and the coil current ΔiL is represented by Equation (8).

[Mathematical 5]

$$\Delta VC = \frac{A \times (VIN + VO) - A \times VO}{R1} \times \frac{1}{C1} \times t = \frac{A \times VIN}{R1} \times \frac{1}{C1} \times t \qquad (7)$$

$$\Delta iL = \frac{VLX1}{L} \times t \qquad (8)$$

In the above-mentioned coil current emulation circuit 4, the Hi level of the one terminal LX1 is nearly equal to the input voltage VIN, while the Hi level of the other terminal LX2 is nearly equal to the output voltage VO. Moreover, the proportionality coefficient A, the resistance value of the resistor R1, the capacity of the capacitor C1, and the inductance of the coil L are constants. Hence, it is seen that the potential difference ΔVC similar to the coil current ΔiL is obtained from the output terminal VC of the coil current emulation circuit 4.

<Second Embodiment>

Figure 9:
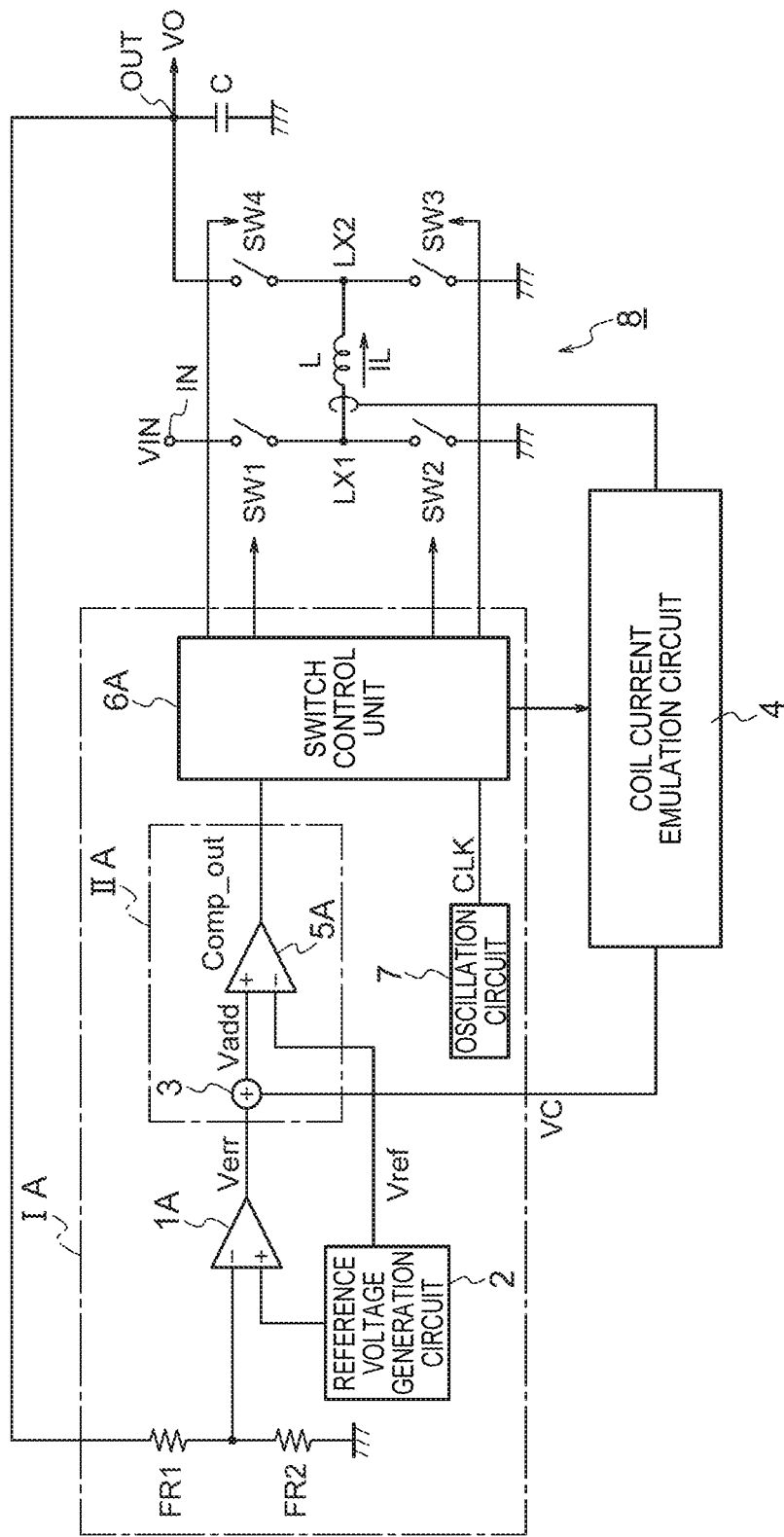
FIG. 9 is a block diagram showing a switching power supply circuit according to a second embodiment of the present invention.

FIG. 9 is a block diagram showing the switching power supply circuit according to a second embodiment of the present invention. This switching power supply circuit is an example on the peak detection system. In the present embodiment, the same parts as those in the first embodiment are assigned the same numerals or symbols as those in the first embodiment, and duplicate explanations are omitted.

As shown in FIG. 9, the switching power supply circuit according to the present embodiment has a control circuit IA, a coil current emulation circuit 4, and a switching circuit 8, as in the first embodiment. The control circuit IA performs ON/OFF control of the switching circuit 8, based on a feedback voltage, which represents an output voltage VO being a voltage of an output terminal OUT, and an output voltage VC of the coil current emulation circuit 4, to have the switching circuit 8 carry out a predetermined buck, boost or buck-boost action so that the output voltage VO generated in the output terminal OUT of the switching circuit 8 becomes a predetermined set voltage. For this purpose, the control circuit IA according to the present embodiment is equipped with an error amplification circuit 1A, a reference voltage generation circuit 2, a peak detection circuit IIA composed of a summing circuit 3 and a comparison circuit 5A, a switch control unit 6A, and an oscillation circuit 7.

The switching power supply circuit according to the present embodiment is on the peak detection system. Thus, its control circuit IA is somewhat different from the control circuit I of the first embodiment owing to a difference in system between the valley detection system and the peak detection system. That is, signals supplied to a non-inverting input terminal and an inverting input terminal of each of the error amplification circuit 1A and the comparison circuit 5A of the peak detection circuit IIA are opposite to those in the first embodiment.

That is, the output voltage VO given as a feedback is divided by feedback resistors FR1, FR2, and inputted to the inverting input terminal of the error amplification circuit 1A. On the other hand, the non-inverting input terminal of the error amplification circuit 1A receives an input of a reference voltage Vref which has been generated by the reference voltage generation circuit 2 and preliminarily set. Thus, the error amplification circuit 1A compares the reference voltage Vref with the output voltage VO divided by the feedback resistors FR1, FR2, amplifies an error which is the difference between Vref and VO, and outputs the amplified value as an error voltage Verr.

The peak detection circuit IIA is supplied with the output voltage VC of the coil current emulation circuit 4 which is similar to a coil current IL flowing through a coil L; the error voltage Verr, and the reference voltage Vref. Based on the output voltage VC, the error voltage Verr, and the reference voltage Vref, the peak detection circuit IIA detects a peak where the coil current IL is maximal, to generate a peak detection signal Comp_out.

The peak detection circuit IIA in the present embodiment is composed of the summing circuit 3 and the comparison circuit 5A. In the summing circuit 3, the output voltage VC similar to the coil current IL is added to the error voltage Verr, which is the output of the error amplification circuit 1A, to generate an addition output voltage Vadd. The output voltage VC is generated in the same coil current emulation circuit 4 as that in the first embodiment.

In the present embodiment, the reference voltage Vref, which is the output of the reference voltage generation circuit 2, is inputted to the inverting input terminal of the comparison circuit 5A. At the same time, the addition output voltage Vadd, which is the output of the summing circuit 3, inputted to the non-inverting input terminal of the comparison circuit 5A. As a result, the comparison circuit 5A generates the peak detection signal Comp_out, which represents a time point at which the addition output voltage Vadd of the summing circuit 3 exceeds the reference voltage Vref, namely, a time point at which the coil current IL takes the highest value; and outputs this peak detection signal Comp_out to the switch control unit 6A. The peak detection signal Comp_out is a state signal representing two states, Hi and Lo.

In the present embodiment, the peak detection circuit IIA is formed from a combination of the summing circuit 3 and the comparison circuit 5A, as described above, but this is not limiting. As long as the peak detection circuit IIA is configured to detect the peak, where the coil current IL is maximal, based on the output voltage VC similar to the coil current IL, the error voltage Verr, and the reference voltage Vref, there is no more special limitation. In the present embodiment, moreover, the summing circuit 3 adds the output voltage VC to the error voltage Verr, and the addition output voltage Vadd from the summing circuit 3 is compared with the reference voltage Vref, but these features are not limiting. It suffices that the peak detection circuit IIA is configured to generate the addition output voltage Vadd based on the error voltage Verr, the reference voltage Vref, and the output voltage VC.

The switch control unit 6A controls ON/OFF of switching elements SW1, SW2, SW3, SW4 of the switching circuit 8 in accordance with a timing, which represents the passage of a preset elapsed time (to be described in detail later), and a change in the state of the peak detection signal Comp_out, based on a clock signal CLK of a constant frequency generated by the oscillation circuit 7. By so doing, the switch control unit 6A exercises control to switch among a buck mode, a buck-boost mode, and a boost mode, as appropriate, thereby keeping the output voltage VO constant. Simultaneously, the switch control unit 6A also controls the switching action of switch means S1, S2, S3 (see FIG. 8) of the coil current emulation circuit 4 to be described in detail later. The concrete contents of switching control by the switch control unit 6A will be described in detail later.

The peak detection signal Comp_out, which is the output of the comparison circuit 5A, is normally in the Lo state, and enters the Hi state upon detection of the peak point.

The switching circuit 8 is formed by combining the four switching elements SW1 to SW4 with the coil L in the shape of H as in the first embodiment. In further detail, the switching element SW1 is connected between an input terminal IN, where an input voltage VIN being a power supply voltage is applied, and one terminal LX1 of the coil L; the switching element SW2 is connected between a ground potential and the one terminal LX1; the switching element SW3 is connected between the ground potential and the other terminal LX2 of the coil L; and the switching element SW4 is connected between the output terminal OUT and the other terminal LX2. To the output terminal OUT, a smoothing capacitor C is connected. In the present embodiment, a capacitor with low ESR, such as a ceramic capacitor, can be used as the capacitor C.

The control actions of the switch control unit 6A in the respective modes, buck mode, buck-boost mode, and boost mode, will be described based on waveform charts of FIGS. 10 to 14. In FIGS. 10 to 14, (a) shows the waveform of the clock signal, (b) shows the waveform of the peak detection signal Comp_out, (c) shows the waveform of the one terminal LX1, (d) shows the waveform of the other terminal LX2, and (e) shows the waveform of the coil current IL. In each of the drawings, (f) to (h) show the waveforms in the respective parts of the coil current emulation circuit 4 (see FIG. 8) in the respective modes. More detailedly, in each drawing, (f) shows the waveform of the voltage at one terminal V1 (see FIG. 8), (g) shows the waveform of the voltage at the other terminal V2 (see FIG. 8), and (h) shows the waveform of the output voltage VC (see FIG. 8).

<Buck Mode>

FIG. 10 shows the waveform chart in the buck mode. As shown in this drawing, the peak detection signal Comp_out, which is the output of the peak detecting comparison circuit 5A, is reset by the clock signal CLK of the oscillation circuit 7. As a result, the peak detection signal Comp_out enters the Lo state.

Then, when the peak detection signal Comp_out changes to Hi earlier than a first timing t1 of two timings preset within the switch control unit 6A in accordance with the input voltage VIN, the output voltage VO, or the reference voltage Vref, the one terminal LX1 of the coil L is switched from the Hi level to the Lo level (the switching element SW1 is turned OFF). Since, during this period, the terminal LX1 falls into the Lo level, an OFF-period in which the coil current IL gradually decreases is provided.

Then, at a second timing t2, the terminal LX1 is switched to the Hi level to establish an ON-period. Here, the first timing t1 is later than the switching of the peak detection signal Comp_out, and thus becomes ineffective. During such a series of actions, the terminal LX2 is fixed at Hi. By repeating these actions, the circuit of the present embodiment works as a buck converter, stabilizing the output voltage VO.

FIGS. 11 to 13 are timing charts in the buck-boost mode. Although all these drawings show the buck-boost mode, FIG. 11 shows a state where the input voltage VIN is higher than the output voltage VO, FIG. 12 shows a state where the input voltage VIN is equal to the output voltage VO, and FIG. 13 shows a state where the input voltage VIN is lower than the output voltage VO.

<Buck-Boost Mode>

In the buck-boost mode, as shown in FIGS. 11 to 13, the peak detection signal Comp_out is reset by the clock signal CLK, as in the buck mode. At the first timing t1, the terminal LX2 is switched from the Hi level to the Lo level, bringing out an ON-period. As a result, the coil current IL is on the increase.

In this buck-boost mode, unlike the buck mode, the peak detection circuit IIA detects the peak point earlier than the second timing t2 to switch the terminal LX1 to the Lo level and the terminal LX2 to the Hi level.

Then, at the second timing t2, the action of returning the terminal LX1 to the Hi level is performed. Such actions are repeated, whereby the circuit of the present embodiment is made to work as a buck-boost converter to stabilize the output voltage VO.

In the present embodiment, the buck-boost action is realized by combining the buck action of switching the one terminal LX1 and the boost action of switching the other terminal LX2. In the buck-boost action, the period during which both the one terminal LX1 and the other terminal LX2 are at the Hi level is provided, whereby changes in the coil current IL due to the full-bridge action can be kept smaller, as in the first embodiment. This feature can contribute to an improvement in the conversion efficiency of the switching power supply circuit. At the boundary between the buck mode and the buck-boost mode, moreover, the mode of action shifts owing to the presence or absence of extremely tiny pulses in the other terminal LX2. Thus, great changes in the coil current due to a mode difference do not occur, and continuity can be maintained. This can contribute to a stable action. A detailed explanation in this connection will be offered based on FIGS. 15(a) to 15(c).

FIG. 15(a) shows the same switching circuit 8 (see FIG. 9; the same applies hereinafter) as that in the present embodiment. When the switching circuit 8 is driven with the full-bridge action of alternately repeating the ON-state of the switching elements SW1, SW3 and the ON-state of the switching elements SW2, SW4, the coil current IL increases as shown in FIG. 15(b), and its loss also increases correspondingly. In the present embodiment, therefore, a period during which the switching elements SW1, SW4 are kept in the ON-state is provided from a predetermined timing after the coil current IL falls short of a predetermined output current IO in the ON-state of the switching elements SW2, SW4 until a predetermined timing before the coil current IL exceeds the output current IO in the ON-state of the switching elements SW1, SW3, as shown in FIG. 15(c). That is, the period during which the switching elements SW1, SW4 are in the ON-state is provided between the period during which the switching elements SW2, SW4 are in the ON-state and the period during which the switching elements SW1, SW3 are in the ON-state. By so doing, the coil current IL during the full-bridge period can be kept down to a constant low value. As a result, losses can be decreased markedly.

<Boost Mode>

FIG. 14 is the waveform chart in the boost mode. In this mode, as shown in the drawing, the peak detection signal Comp_out of the peak detection circuit IIA is reset by the clock signal CLK which is the output of the oscillation circuit 7. After resetting by the clock signal CLK, the terminal LX2 is switched from the Hi level to the Lo level at the first timing t1. At this time, the LX1 remains at the Hi level. Since the terminal LX2 comes to the Lo level, an ON-period during which the coil current IL gradually increases is provided.

The peak detection circuit IIA detects the peak point, whereupon the output level of the peak detection signal Comp_out is switched to Hi and latched there, while the terminal LX2 is switched to the Hi level. As a result, an OFF-period in which the coil current IL gradually decreases is provided.

Then, the peak detection signal Comp_out is reset by the clock signal CLK to bring about a new cycle. Here, the second timing t2 is earlier than the switching of the peak detection signal Comp_out, and thus becomes ineffective. By repeating such actions, the circuit of the present embodiment works as a buck converter to stabilize the output voltage VO.

Because of the above-described actions, the switching power supply circuit according to the present embodiment works as a buck-boost switching regulator.

Next, detection of the coil current IL will be described. If the coil current IL is detected using a sense resistor, problems as described in the aforementioned paragraph [0009] are posed. In the present embodiment, therefore, the output voltage VC similar to the coil current IL is generated by the coil current emulation circuit 4, and this output voltage VC is utilized to obtain information on the predetermined coil current IL. The coil current emulation circuit 4 as described here has exactly the same configuration as that in the first embodiment. Hence, explanations for it in the present embodiment are omitted.

The switching power supply circuits according to the first and second embodiments described as above are on the so-called current mode control system under which the switching operation of the switching elements SW1 to SW4 is controlled based on the coil current IL. However, this is not limiting. As long as the switching circuit 8 and the coil current emulation circuit 4 are combined with the control unit performing the ON/OFF control of the switching circuit 8, there is no more special limitation. Thus, the present invention is applicable to a switching power supply circuit 5 on a so-called voltage mode control system, or to a switching power supply circuit on a hysteresis control system. Under the voltage mode control system, basically, a feedback voltage and a reference voltage are compared and, in accordance with an error between these voltages, a PWM signal for performing switching is generated. In this case, it suffices to construct a control circuit appropriate to such tasks. Under the hysteresis control system, basically, output ripples are detected, and a control signal for performing switching is generated. Construction of a control circuit suitable for such tasks is sufficient.

EXPLANATIONS OF LETTERS OR NUMERALS

I, IA Control circuit
II Valley detection circuit
IIA Peak detection circuit
1, 1A Error amplification circuit
2 Reference voltage generation circuit
3 Summing circuit
4 Coil current emulation circuit
5, 5A Comparison circuit
6, 6A Switch control unit
7 Oscillation circuit
8 Switching circuit
9 Integration circuit

The invention claimed is:

1. A switching power supply circuit, comprising:
a switching circuit having a first switching element connected between an input terminal, where an input voltage is applied, and one terminal of a coil; a second switching element or a first diode connected between a ground potential and the one terminal; a third switching element connected between the ground potential and another terminal of the coil; and a fourth switching element or a second diode connected between an output terminal and the other terminal;
a coil current emulation circuit for generating an output voltage similar to a coil current flowing through the coil; and
a control circuit which, based on a feedback voltage representing an output voltage being a voltage of the output terminal, and the output voltage of the coil current emulation circuit, performs on-off control of the switching circuit to have the switching circuit carry out a predetermined buck-boost action so that the output voltage generated at the output terminal of the switching circuit becomes a predetermined set voltage,
wherein the coil current emulation circuit has a CR integration circuit, and provides an output terminal, between a capacitor and a resistor constituting the CR integration circuit, for outputting the output voltage similar to the coil current,
one of three voltages is applied to one terminal of the CR integration circuit by selection associated with an on/off action of switch means, while a voltage proportional to the output voltage is applied to another terminal of the CR integration circuit, and
the three voltages are a voltage proportional to the input voltage, a ground voltage, and a voltage proportional to a sum of the input voltage and the output voltage, and on/off control of the switch means is performed by a control signal which is outputted by the control circuit in accordance with a state of the one terminal and the other terminal of the coil,
wherein the control circuit comprises:
an error amplification circuit for comparing a predetermined reference voltage with the feedback voltage, and amplifying an error representing a difference between the reference voltage and the feedback voltage to generate an error voltage;
a valley detection circuit for detecting a valley, where the coil current is minimal, based on the output voltage similar to the coil current, the error voltage, and the reference voltage, to generate a valley detection signal representing the valley; and
a switch control unit which generates a switching signal for performing changeover control of the switching element based on the valley detection signal and a predetermined timing representing passage of a preset time, thereby performing the predetermined buck-boost action via the switching circuit; and performs the on/off control of the switch means by the control signal, and
wherein the valley detection circuit comprises:
a summing circuit for adding the output voltage similar to the coil current to the error voltage to generate an addition output voltage, and
a valley detecting comparison circuit for comparing the addition output voltage with the reference voltage to detect the valley.

2. The switching power supply circuit according to claim 1, wherein
the predetermined timing is defined based on the output voltage, the input voltage, or the reference voltage.

3. A switching power supply circuit, comprising:
a switching circuit having a first switching element connected between an input terminal, where an input voltage is applied, and one terminal of a coil; a second switching element or a first diode connected between a ground potential and the one terminal; a third switching element connected between the ground potential and another terminal of the coil; and a fourth switching element or a second diode connected between an output terminal and the other terminal;
a coil current emulation circuit for generating an output voltage similar to a coil current flowing through the coil; and
a control circuit which, based on a feedback voltage representing an output voltage being a voltage of the output terminal, and the output voltage of the coil current emulation circuit, performs on-off control of the switching circuit to have the switching circuit carry out a predetermined buck-boost action so that the output voltage generated at the output terminal of the switching circuit becomes a predetermined set voltage,
wherein the coil current emulation circuit has a CR integration circuit, and provides an output terminal, between a capacitor and a resistor constituting the CR integration circuit, for outputting the output voltage similar to the coil current,
one of three voltages is applied to one terminal of the CR integration circuit by selection associated with an on/off action of switch means, while a voltage proportional to the output voltage is applied to another terminal of the CR integration circuit, and
the three voltages are a voltage proportional to the input voltage, a ground voltage, and a voltage proportional to a sum of the input voltage and the output voltage, and on/off control of the switch means is performed by a control signal which is outputted by the control circuit in accordance with a state of the one terminal and the other terminal of the coil, wherein the control circuit comprises:

an error amplification circuit for comparing a predetermined reference voltage with the feedback voltage, and amplifying an error representing a difference between the reference voltage and the feedback voltage to generate an error voltage;

a peak detection circuit for detecting a peak, where the coil current is maximal, based on the output voltage similar to the coil current, the error voltage, and the reference voltage, to generate a peak detection signal representing the peak; and a switch control unit which generates a switching signal for performing changeover control of the switching element based on the peak detection signal and a predetermined timing representing passage of a preset time, thereby performing the predetermined buck-boost action via the switching circuit; and performs the on/off control of the switch means by the control signal, and wherein the peak detection circuit comprises:

a summing circuit for adding the output voltage similar to the coil current to the error voltage to generate an addition output voltage, and a peak detecting comparison circuit for comparing the addition output voltage with the reference voltage to detect the peak.

4. The switching power supply circuit according to claim 3, wherein the predetermined timing is defined based on the output voltage, the input voltage, or the reference voltage.

* * * * *